United States Patent [19]

Malhi

[11] Patent Number: 4,689,871
[45] Date of Patent: Sep. 1, 1987

[54] METHOD OF FORMING VERTICALLY INTEGRATED CURRENT SOURCE

[75] Inventor: Satwinder D. S. Malhi, Garland, Tex.

[73] Assignee: Texas Instruments Incorporated, Dallas, Tex.

[21] Appl. No.: 779,748

[22] Filed: Sep. 24, 1985

[51] Int. Cl.[4] .................. H01L 21/302; H01L 21/441
[52] U.S. Cl. ........................ 437/40; 156/643;
357/55; 148/DIG. 50; 148/DIG. 131; 437/225;
437/203
[58] Field of Search ............ 156/643, 653, 648;
357/23.6, 55; 29/576 W, 580, 571, 576 B;
148/DIG. 50, 1.5, DIG. 106

[56] References Cited

U.S. PATENT DOCUMENTS

| | | | |
|---|---|---|---|
| 3,920,482 | 11/1975 | Russel | 148/1.5 |
| 4,116,720 | 9/1978 | Vinson | 148/1.5 |
| 4,353,086 | 10/1982 | Jaccodine et al. | 357/51 |
| 4,476,622 | 10/1984 | Cogan | 29/571 |
| 4,502,914 | 3/1985 | Trumpp et al. | 156/643 |
| 4,520,552 | 6/1985 | Arnould et al. | 29/571 |

OTHER PUBLICATIONS

Chang, "Vertical FET Random Access Memories with Deep Trench Isolation", vol. 22, No. 8B, Jan. 1980, pp. 3683–3687.

Primary Examiner—Brian E. Hearn
Assistant Examiner—Tom Thomas
Attorney, Agent, or Firm—Douglas A. Sorensen; Leo N. Heiting; Melvin Sharp

[57] ABSTRACT

A current source MOSFET is fabricated by forming a trench (36) in an n++ drain (source) region (32) and extending below the trench (36). A gate oxide layer (40) is disposed on the sidewalls of the trench (36) and a conductive region (38) formed in the bottom of the trench (36). A gate-to-source (gate-to-drain) contact (49) is then formed in the trench (36) and then a drain (source) contact (58) formed. The vertical gate structure defines a vertical channel region on all sides of the trench (36) to allow a wider devive to be fabricated in a smaller overall silicon area.

11 Claims, 10 Drawing Figures

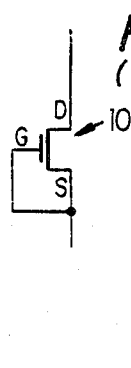
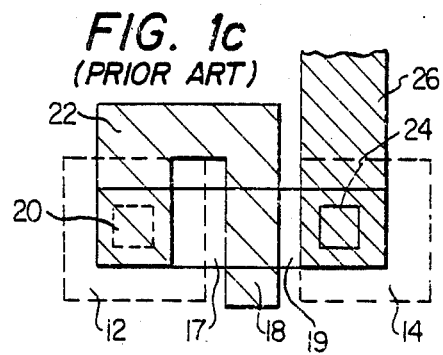
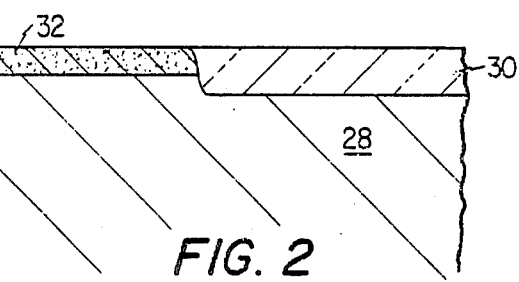
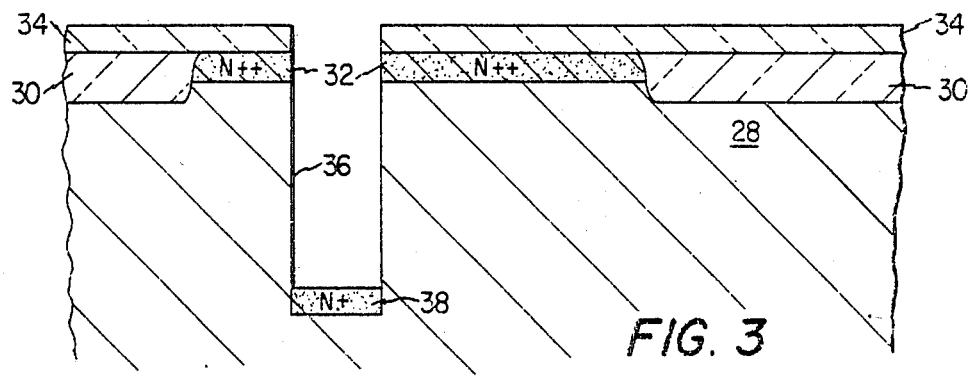
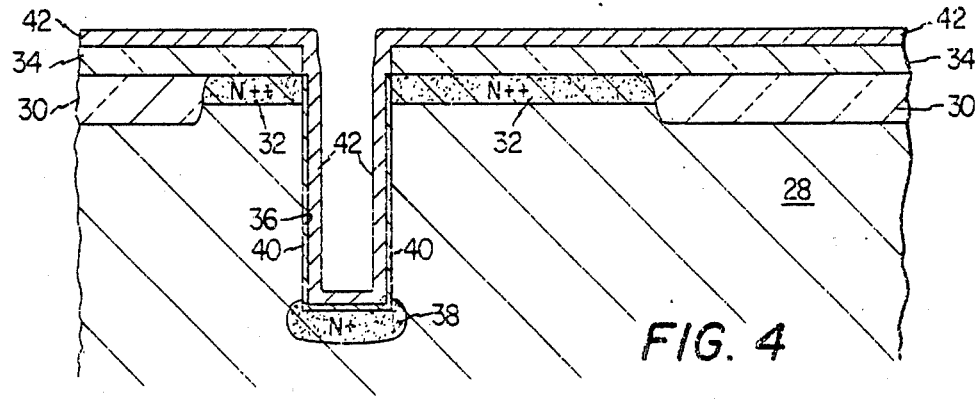

METHOD OF FORMING VERTICALLY INTEGRATED CURRENT SOURCE

TECHNICAL FIELD OF THE INVENTION

The present invention pertains in general to the fabrication of MOS transistors and, more particularly, to the fabrication of a MOS current source utilizing trenching techniques.

BACKGROUND OF THE INVENTION

As integrated circuit technology advances, demands for increased packing density, low power dissipation per square centimeter and compatibility between the various technologies increases. High packing density, usually obtained through device shrinkage, requires highly sophisticated processing techniques such as E-beam lithography, reactive ion etching, transient annealing, etc. However, in addition to these techniques, additional techniques are necessary to further reduce size, thereby reducing the required silicon overhead.

One type of device widely utilized in MOSFET circuits is a current source. The current source is conventionally fabricated by either connecting the gate of a transistor to the source thereof or the gate to the drain thereof. This results in a two terminal device. In conventional layout design, this element, although requiring only two terminals, consumes the same area as a three terminal transistor in addition to the area required to connect the gate to the doped drain or source. In conventional fabrication of the current source, buried source and drain regions are disposed on either side of a channel region which is covered by the gate. A polycrystalline silicon layer is then wrapped around from the gate to either the source or the drain. Therefore, a current source is merely a modification of the three terminal device with no savings in silicon overhead.

In view of the above disadvantages with present layout techniques for current sources, there exists a need for improved methods for fabricating a current source to minimize the silicon overhead.

SUMMARY OF THE INVENTION

The present invention disclosed herein comprises a method for forming a semiconductor current source. A first buried region is formed by doping a silicon substrate of a first conductivity type with a dopant of a second conductivity type. A trench is then formed in the first buried region by anisotropically etching the silicon substrate to a predetermined depth below the first buried region. A gate oxide layer is formed on the sidewalls of the trench and then a second buried region is defined at the bottom of the trench by ion implanting a dopant of the second conductivity type therein. A layer of polycrystalline silicon is then conformally deposited over the substrate to cover the sidewalls and the bottom of the trench such that the trench is filled. The polycrystalline silicon layer is then patterned and etched to define a first terminal for the current source. A metallic contact is then formed to the first buried region to form a second terminal for the current source. A channel region is defined between the first buried region and the second buried region in the silicon substrate adjacent the sidewalls of the trench.

BRIEF DESCRIPTION OF THE DRAWINGS

For a more complete understanding of the present invention and the advantages thereof, reference is now made to the following description taken in conjunction with the accompanying Drawings, in which:

FIGS. 1a, 1b and 1c illustrate a prior art current source and the conventional layout topology thereof;

FIG. 2 illustrates a cross-sectional view of the initial step of fabrication of the silicon substrate to define the moat area and form a buried n++ region;

FIG. 3 illustrates a cross-sectional view of the silicon substrate with the trench defined therein and a buried n+ region positioned at the bottom thereof;

FIG. 4 illustrates a cross-sectional view of the silicon substrate with a gate oxide and a layer of polysilicon formed in the trench;

DETAILED DESCRIPTION OF THE INVENTION

Figure 5:
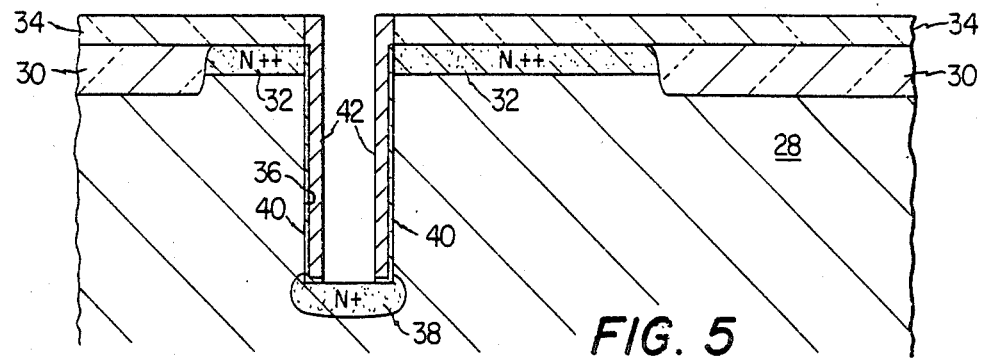
FIG. 5 illustrates a cross-sectional view of the silicon substrate with the polysilicon layer and oxide layer etched away to expose the n+ region in the bottom of the trench.
Figure 6:
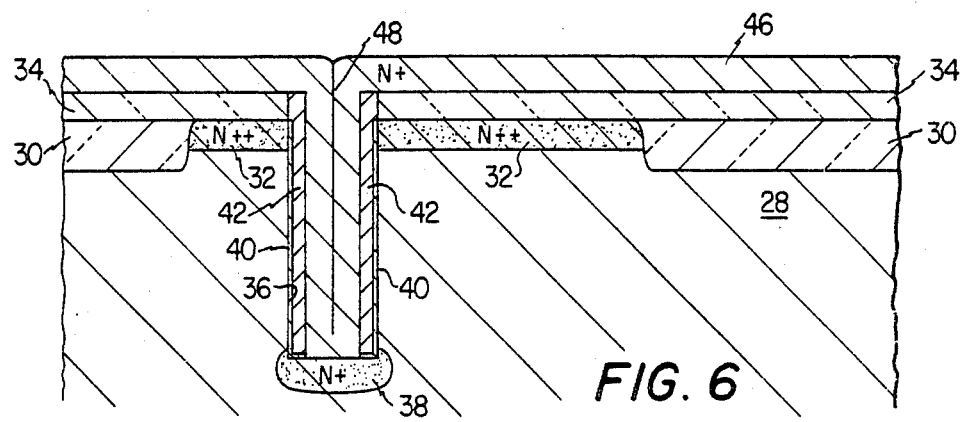
FIG. 6 illustrates a cross-sectional view of the silicon substrate with polysilicon deposited in the trench.
Figure 7:
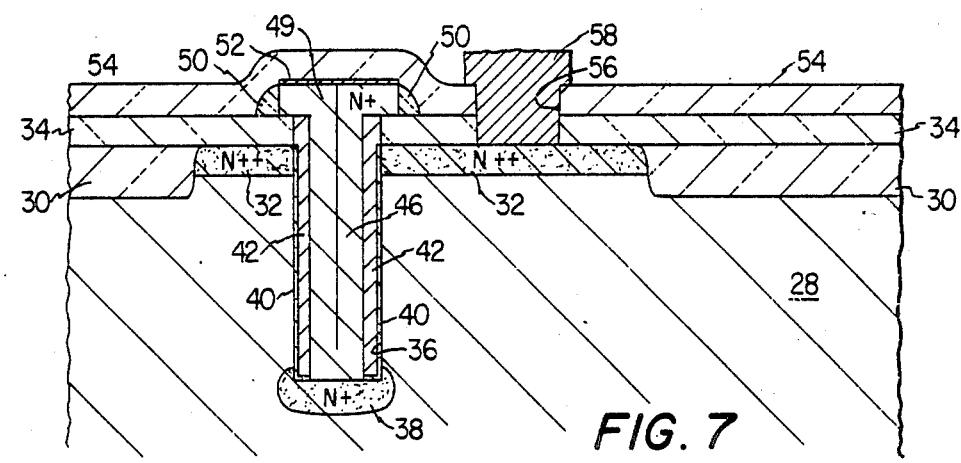
FIG. 7 illustrates a cross-sectional view of the silicon substrate with the gate to source (drain) contact formed with the final metallization step forming the contact with the drain (source) region.

Referring now to FIG. 1a, there is illustrated a schematic diagram of a current source 10. The current source 10 is comprised of a depletion mode transistor having a drain, a gate and a source. The gate is connected to the source to form a two-terminal circuit element. alternatively, as shown in FIG. 1b, a current source 11 is formed with an enhancement mode transistor having the gate connected to the drain. FIG. 1c illustrates the prior art layout topology. In the layout, an n++ buried region 12 is patterned and implanted to define the source (drain) and an n++ buried region 14 is patterned and implanted to define the drain (source). The regions 12 and 14 are connected to n+ source/drain regions 17 and 19 separated by a gate 18 formed from polycrystalline silicon (poly) disposed thereover. A channel region underlies the gate 18. A contact 20 is made to the source (drain) region 12 and connected to gate 18 through a poly run 22 to form the gate-to-source (gate-to-drain) connection. A contact 24 is made to the drain (source) region 14 and interconnected with a metal run 26. For a process utilizing one micron minimum feature size and one-quarter micron alignment tolerance, the topology of FIG. 1b lays out 6.5 microns on one side and 4.5 microns on the other side.

Referring now to FIG. 2, there is illustrated a cross-sectional diagram of the initial step in the fabrication process of the trench based current source of the present invention. In the preferred embodiment, NMOS technology is utilized. In conventional fabrication of MOSFETs, a thin wafer of semiconductor material of one type conductivity, such as that identified by reference numeral 28 is first masked by a stack of oxide and nitride. The nitride is then removed in a pattern to expose only those areas where field oxide is to be formed. The substrate 28 is then subjected to oxidation in steam with an ambient temperature of approximately 900° C. A surface insulating layer 30, referred to as a field oxide of silicon, results from oxide growth and diffusion steps in the process, thus creating a layer of sufficient thickness so that later, when the thin layers of metalizations are applied, any electric fields developed in normal operation of the devices are insufficient to adversely affect operation of the portion of the semiconductor element, other than those where the insulating layer is intentionally thin.

After forming the field oxide layer 30, a buried n++ region 32 is formed in the moat area. The n++ region 32 is formed by implanted arsenic therein followed by a subsequent annealing step. The arsenic is implanted to a level of $5 \times 10^{+15}/cm^2$ to result in a doped region with a thickness of approximately 0.5 microns.

After forming the buried n++ region 32, a layer of oxide 34 is deposited on the substrate, as illustrated in FIG. 3. The surface of the substrate is then patterned and a trench 36 formed through the oxide layer 34 and the buried n++ region 32 with an anisotropic etching procedure. This procedure essentially uses reactive ion etching in HCl. The trench 36 is formed to a depth of approximately 2 microns with a width of approximately 1 micron such that the bottom of the trench 36 is below the buried n++ region 32. A buried n+ region 38 is then implanted in the bottom of the trench utilizing arsenic with a dose of approximately $5 \times 10^{+14}/cm^2$. As will be described hereinbelow, that portion of the silicon substrate 28 adjacent the sidewalls of the trench 36 and between the n++ region 32 and the bottom of the trench 36 comprises the channel region of the current source.

A dummy gate oxide is grown on the inner surfaces of the trench 36 followed by a wet etch to remove the dummy gate oxidation. This essentially cleans the surfaces of the trench 36.

A layer of gate oxide 40 is grown on the exposed silicon surfaces of the trench 36. The gate oxide layer 40 is grown by disposing the wafer in an oxygen environment at a temperature of approximately 900° C. for sixty minutes. This results in a thickness of silicon dioxide ($SiO_2$) of approximately 300 Å on all exposed silicon surfaces.

After formation of the gate oxide layer 40, a layer of n+ doped polysilicon 42 is deposited to a thickness of approximately 1000 Å, as illustrated in FIG. 4. The poly layer 42 is a conformal layer and is deposited with an in situ dopant process utilizing either arsene gas or phosphene gas as the dopant material. The purpose of the layer 42 is to protect the gate oxide layer 40 from degradation as a result of further processing steps. As a result of the formation of the gate oxide layer 40, the n+ source region 38 diffuses deeper into the substrate and extends laterally outward.

After formation of the gate oxide layer 40 and the polysilicon layer 42, the wafer is subjected to an anisotropic plasma etch which s a directional etching process. With this process, the portion of the poly layer 42 overlying the oxide layer 34 and the portion of the poly layer 42 overlying the n+ region 38 are removed, as illustrated in FIG. 5. This plasma etching utilizes an HCl-HBr plasma etch.

After exposing the surface of the n+ region 38, a layer 46 of in situ doped poly is then deposited by LPCVD techniques to a thickness of approximately 0.5 microns. This is a conformal coating such that the poly layers 42 on the sidewalls of the trench 36 are coated and the trench 36 is filled. The poly layer 46 comes into direct contact with the n+ region 38 and forms both the contact with the n+ region 38 and also forms the gate in conjunction with the poly layer 42. Therefore, the gate and source (drain) are connected together in this configuration.

Although the thickness of the poly layer does not have to completely fill the trench 36, it is desirable to do so to ensure that no gap is present where the portions of the poly layer 46 extend outward from the poly layers 42 to form a "crease" 48. This crease 48 is closed. If not, subsequent processes utilizing techniques such as spin-on resist would not allow the substrate surface to be adequately cleaned.

The channel region for the transistor illustrated in FIGS. 2-6 is directly adjacent the gate oxide 40 between the region 38 and the region 32. As can be seen from FIG. 6, this channel region extends all the way around the sidewalls of the trench 36. This results in a relatively "wide" device wherein the width to length ratio of the transistor has been increased. Conventionally, as device dimensions decrease, the channel regions also decrease, resulting in "narrow" transistors. This usually involves some significant performance tradeoffs. With the process of the present invention, the channel width can be maintained for a relatively compact device since it is determined by periphery of the trench 36.

After deposition of the poly layer 46, the poly layer 46 is patterned and then etched to define a poly run 49. Thereafter, another conformal layer of LPCVD oxide is deposited on the substrate to a thickness of approximately 4500 Å. This layer is then subjected to an anisotropic etch to clear the oxide from flat surfaces. This etch leaves a sidewall oxide 50 adjacent the exposed edges of the poly run 49. The purposes of the sidewall oxide is to seal the edges of the poly run 48 for a subsequent siliciding process.

After formation of the sidewall oxide 50, titanium is then sputtered on the surface of the device in a vacuum apparatus to a thickness of approximately 900 Angstroms. The titanium is then reacted at a temperature of approximately 675° C. in an inert atmosphere such as hydrogen, argon or a vacuum for thirty minutes. This reaction allows the titanium to consume silicon or polysilicon only where it is in contact therewith to form titanium di-silicide. This results in a thickness of titanium di-silicide of approximately 1500 Å. The substrate is then etched in an acid solution to remove the titanium without affecting the titanium di-silicide. For example, a suitable etching in the case of titanium is a wet etch comprising a solution of $H_2SO_4$ and $H_2O_2$. Since titanium only reacts with silicon, all areas which are covered by oxide have the titanium removed therefrom. The substrate is then annealed for thirty minutes at approximately 800° C. to stabilize and further lower the resistivity of the titanium di-silicide. Titanium di-silicide increases the conductivity of all silicon areas over which it was formed and constitutes a self-aligned process. This results in a silicide layer 52 over the poly run 49. The titanium di-silicide process is described in U.S. Pat. No. 4,545,116, assigned to Texas Instruments Incorporated.

After formation of the silicide, the substrate is covered by a layer of oxide 54 and then a contact area 56 is formed therein to the n++ region 32. A metal contact 58, such as aluminum, is then formed in the contact area 56 by conventional process.

Figure 8:
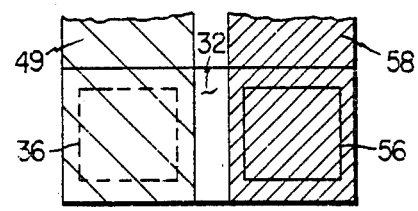
FIG. 8 illustrates a planar view of the layout topology for the current source of the present invention.

Referring now to FIG. 8, there is illustrated a planar view of the topological layout for the current source of the present invention. Although the region 32 is illustrated as extending beyond the meCtal contact 58 and the poly run 49, in the preferred embodiment it is not necessary to extend this n++ region to that extent. It is only necessary that it extends around the trench 36 and to a point in contact with the contact area 56. Therefore, the n++ drain region 32 has the peripheral edges thereof aligned with the peripheral edges of the metal contact 58 and the poly run 49. This topology results in a configuration which is 4.25 microns on one side and 2.5 microns on the other side. This is a reduction of 2.25 microns on one side and 2.0 microns on the other side over the prior art device when considering one micron definition, giving about a factor of three density improvement.

In summary, there has been provided a trench based current source wherein a trench is formed in and extends through an n++ drain (source) region. A source region is formed at the bottom of the trench with a gate oxide formed around the sidewalls of the trench. Metalization is then formed in the trench to both form the gate and the contact with the buried n+ region. This forms a vertical gate which does not take up any silicon overhead for defining the channel region which is also vertical.

Although the preferred embodiment has been described in detail, it should be understood that various changes, substitutions and alterations can be made therein without departing from the spirit and scope of the invention as defined by the appended claims.

What is claimed is:

1. A method for forming a semiconductor device, comprising:
   providing a silicon substrate of a first conductivity type;
   forming a first buried region of a second conductivity type in the silicon substrate;
   forming a trench in the silicon substrate extending through the first buried region, the trench having sidewalls and a bottom, the bottom extending into the substrate and below the first buried region;
   forming an insulating layer on the sidewalls of the trench;
   forming a second buried region of the second conductivity type in the silicon substrate at the bottom of the trench;
   forming a conductive layer over the bottom of the trench contacting said second buried region and over the insulating layer covering the sidewalls of the trench to form a gate region on the sidewalls which is conductively connected with the second buried region;
   the area in the silicon substrate adjacent the trench and between the first and second buried regions comprising a channel region; and
   forming a first interconnect to the conductive layer and forming a second interconnect to the first buried region, the first and second interconnects operable to be interfaced with external circuitry.

2. The method of claim 1 wherein said first and second buried regions are formed by ion implanting a dopant of the second conductivity type in the silicon substrate.

3. The method of claim 1 wherein the trench is formed within the boundaries of the first buried region such that the first buried region surrounds the trench.

4. The method of claim 1 wherein the step of forming the trench comprises an anisotropic etching of the silicon substrate with a reaction ion etching process.

5. The method of claim 1 wherein the step of forming an insulating layer comprises growing an oxide layer on the exposed silicon on the sidewalls and anisotropically etching the portion of the oxide on the bottom of the trench to expose the silicon thereunder.

6. The method of claim 1 wherein the step of forming the conductive layer comprises depositing a layer of polycrystalline silicon in situ doped with second conductivity type dopant onto the substrate to conformally coat the substrate and the trench, the layer of polycrystalline being in contact with the second buried region and the insulating layer and covering the insulating layer.

7. The method of claim 6 wherein the trench is completely filled by the layer of polycrystalline silicon such that no voids are present.

8. A method for forming a semiconductor current source, comprising:
   defining a moat region in a silicon substrate of a first conductivity type;
   ion implanting a dopant of a second conductivity type in the moat region to define a first buried region;
   depositing a layer of protective oxide over the substrate;
   anisotropically etching a trench through said first buried region, the trench having sidewalls and a bottom portion, the bottom portion disposed below the first buried region a predetermined distance;
   ion implanting a dopant of the second conductivity type in the bottom of the trench to define a second buried region, the portion of the silicon substrate between the first buried region and the second buried region adjacent the sidewalls of the trench forming a channel region;
   oxidizing the exposed silicon surfaces on the sidewalls of the trench and in the bottom of the trench to form a gate oxide of a predetermined thickness;
   removing the portion of the gate oxide covering the bottom portion of the trench;
   depositing a conformal layer of polycrystalline silicon over the substrate to cover the gate oxide in the trench and the second buried region and being in conductive contact with the second buried region;
   patterning and etching the polycrystalline silicon layer such that polycrystalline silicon remains over the gate oxide layer in the trench and the second buried region and extends upward above the substrate to define a first terminal for the current source; and
   forming a metal contact to the first buried region to define a second terminal for the current source.

9. The method of claim 8 wherein the step of removing the portion of the oxide over the bottom of the trench further comprises:
   depositing a conformal layer of polycrystalline silicon over the substrate in the trench, the thickness of the polycrystalline silicon being thin relative to the width of the bottom portion of the trench; and
   anisotropically etching the thin polycrystalline silicon layer to expose the bottom portion without effecting the portion of the polycrystalline silicon layer on the sidewalls of the trench covering the gate oxide, the thin polycrystalline layer protecting gate oxide layer.

10. The method of claim 8 wherein the conformal layer of polycrystalline silicon has a thickness that is equal to or greater than one-half the width of the trench such that the trench is completely filled with no voids present.

11. The method of claim 8 wherein the step of anisotropically etching the trench comprises a reactive ion etching process.

* * * * *